(12) United States Patent
Leib et al.

(10) Patent No.: US 7,285,834 B2
(45) Date of Patent: Oct. 23, 2007

(54) PROCESS FOR PRODUCING MICROELECTROMECHANICAL COMPONENTS AND A HOUSED MICROELECTROMECHANICAL COMPONENT

(75) Inventors: Jürgen Leib, Freising (DE); Florian Bieck, Mainz (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 11/378,962

(22) Filed: Mar. 18, 2006

(65) Prior Publication Data

US 2006/0160258 A1 Jul. 20, 2006

Related U.S. Application Data

(63) Continuation of application No. 10/994,659, filed on Nov. 22, 2004, now Pat. No. 7,071,521, which is a continuation of application No. 10/228,804, filed on Aug. 26, 2002, now Pat. No. 6,894,358.

(30) Foreign Application Priority Data

| Aug. 24, 2001 | (DE) | ................................ 101 41 558 |
| Aug. 24, 2001 | (DE) | ................................ 101 41 571 |
| May 23, 2002 | (DE) | ................................ 102 22 959 |

(51) Int. Cl.
*H01L 27/14* (2006.01)
*H01L 21/00* (2006.01)

(52) U.S. Cl. .................. 257/414; 257/432; 257/444; 438/22; 438/32; 438/48

(58) Field of Classification Search .............. 438/22, 438/32, 48, 55; 257/414, 432, 444
See application file for complete search history.

(56) References Cited

U.S. PATENT DOCUMENTS

2002/0135069 A1* 9/2002 Wood et al. ............... 257/758

\* cited by examiner

*Primary Examiner*—Hsien-Ming Lee

(57) ABSTRACT

A process produces microelectromechanical components from a substrate that has a first side and a second side which is substantially opposite from the first side, and at least the first side has at least one microelectromechanical element. The process includes the step of providing at least one conductive passage into the substrate, connecting the first side to the second side, and securing at least one support to the first side of the substrate, with the at least one electrically conductive passage uncovered by thinning the substrate material with the mechanical stability being ensured by the support.

40 Claims, 4 Drawing Sheets

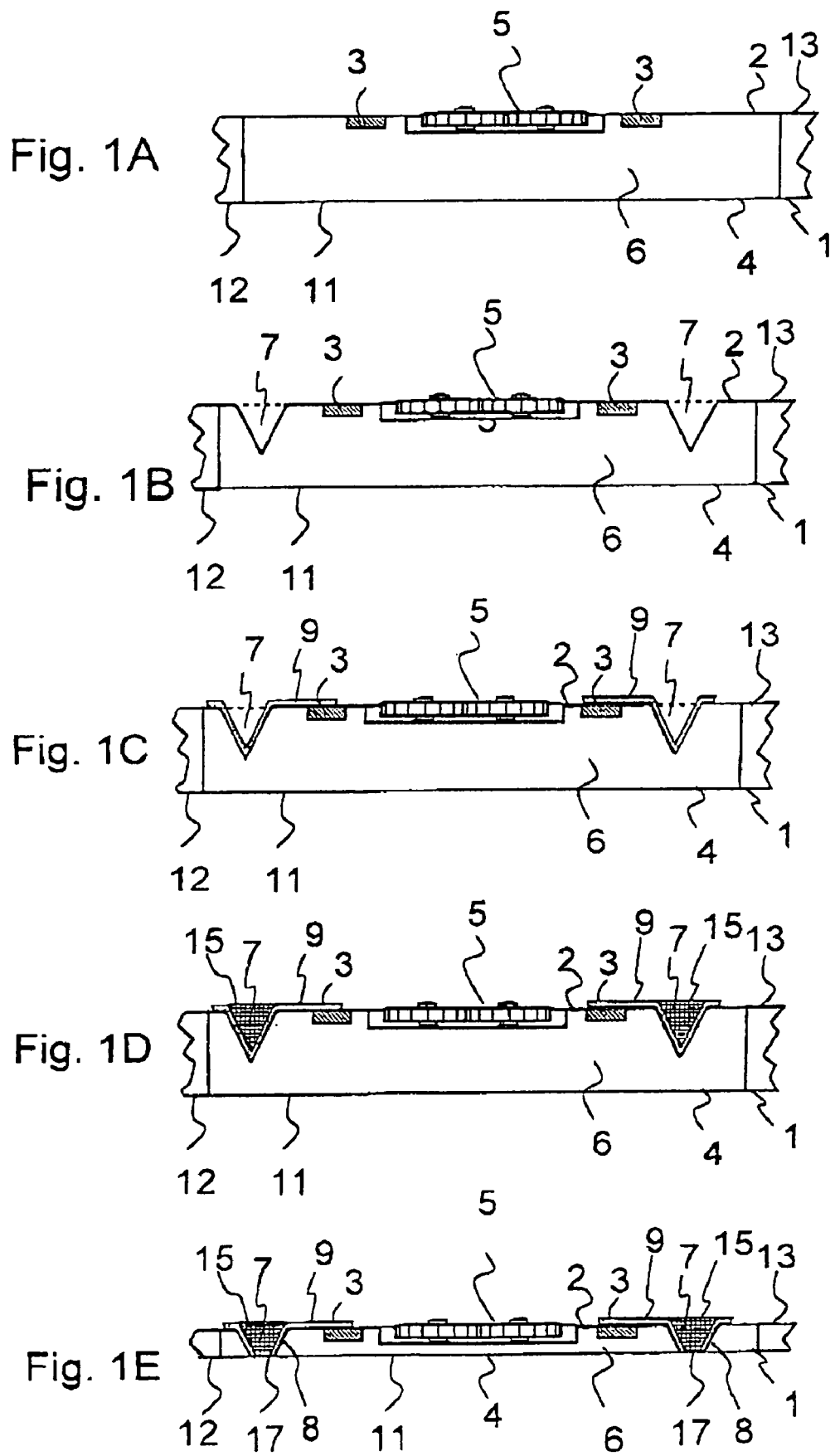

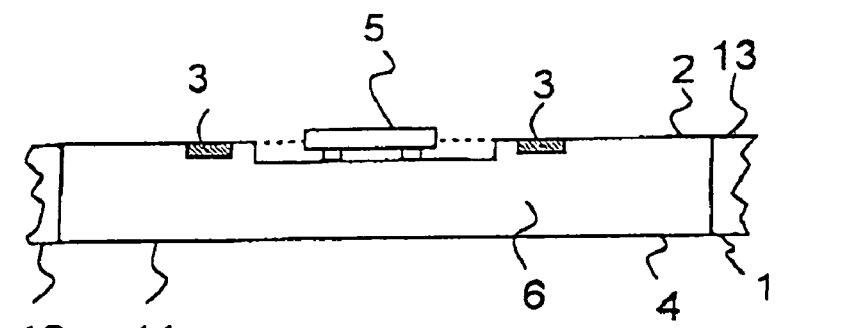
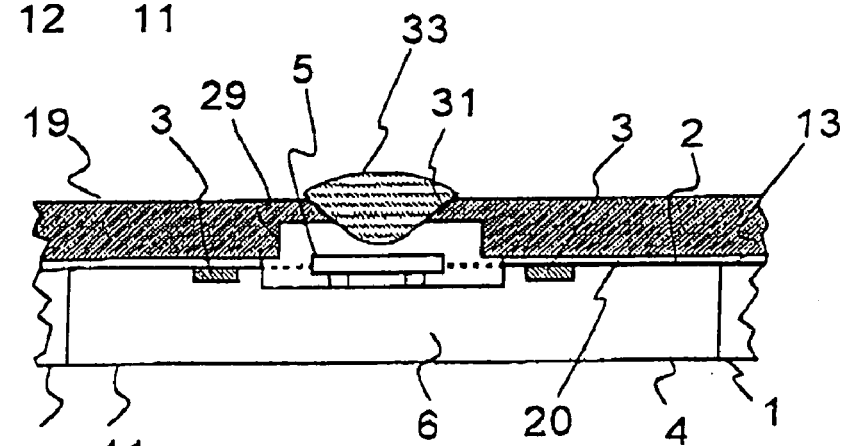
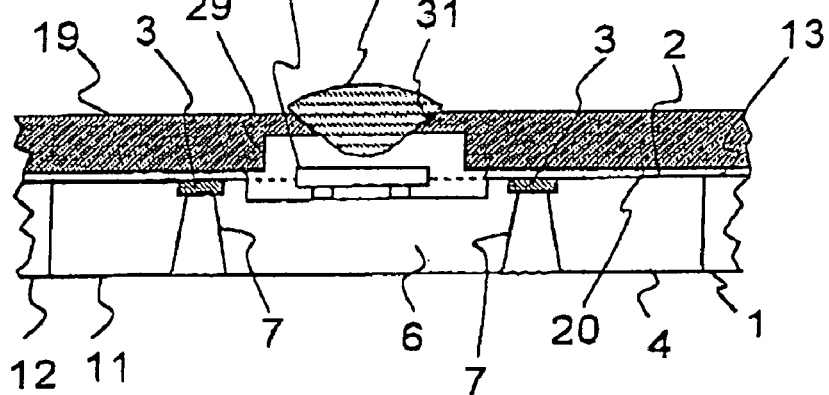
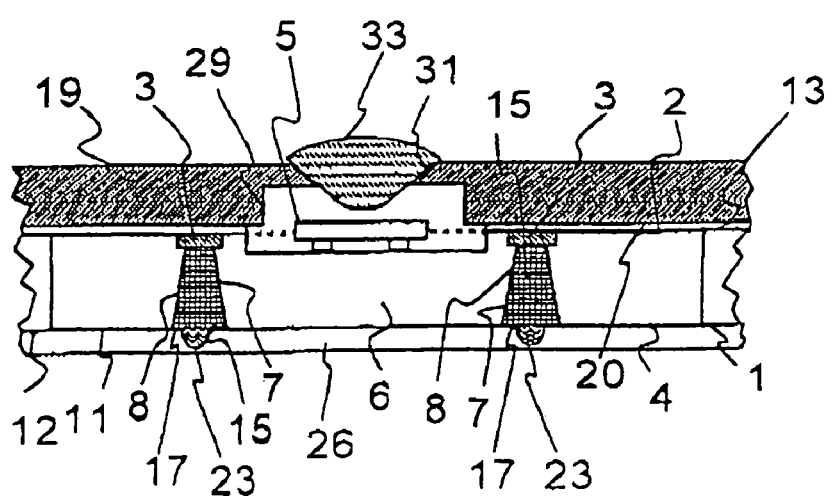

PROCESS FOR PRODUCING MICROELECTROMECHANICAL COMPONENTS AND A HOUSED MICROELECTROMECHANICAL COMPONENT

CROSS-REFERENCES TO RELATED APPLICATIONS

This is a Continuation Application of U.S. patent application Ser. No. 10/994,659, filed Nov. 22, 2004 now U.S. Pat. No. 7,071,521, which was a Continuation of U.S. patent application Ser. No. 10/228,804 (now U.S. Pat. No. 6,894,358) filed Aug. 26, 2002 of the same inventors, which claims priority of the following German Applications: DE 101 41 571.0 filed on Aug. 24, 2001; DE 101 41 558.3 filed on Aug. 24, 2001, and DE 102 22 959.7, filed on May 23, 2002.

STATEMENT REGARDING FEDERALLY SPONSORED RESEARCH OR DEVELOPMENT

Not applicable.

BACKGROUND OF THE INVENTION

The invention relates to a process for producing microelectromechanical components and to a housed microelectromechanical component. In particular, the invention relates to a process for producing housed microelectromechanical components joined to the wafer with a structured support, and to a housed microelectromechanical component with a structured support.

TECHNICAL FIELD

Microelectromechanics is nowadays considered to be one of the key technologies. There are numerous potential and existing applications for microelectromechanical systems (MEMS) in sensor technology, optics and communications technology. For example, MEMS components have already been in use for a number of years as acceleration sensors for airbags in the automotive industry. According to a market research study carried out in 2002 by NEXUS, the European Marketing Organization for MEMS Products, annual growth rates of 20% are likely in the MEMS industry.

However, MEMS modules often have the problem that the spatial arrangement of the contacts makes them have an adverse effect on the function of the mechanical components of the MEMS module. In general, the micromechanical structures are on the same side of a module as its electrical connections. Particularly in the case of MEMS modules with optical functions, however, the connections have to be laid on a side which is opposite from the side with the micromechanical elements, so that the micromechanical elements are not covered, for example, when the arrangement is secured to a circuit board. For this purpose, the contacts are generally led laterally around the microelectromechanical component in the housing of the module. A particular drawback of this is that this type of contact takes up very large amounts of space and is therefore an obstacle to miniaturization. Moreover, contact of this type requires the components to be separated in order to allow contacts to be guided around them. Accordingly, this method is also unsuitable for carrying out while the components are still joined to the wafer.

SUMMARY OF THE INVENTION

Therefore, the invention is based on the object of eliminating or at least alleviating the abovementioned drawbacks in MEMS components and during their production. This object is achieved, in a surprisingly simple way, by a process for producing microelectromechanical components from a substrate having a first side and a second side which is substantially opposite from the first side, at least the first side having at least one microelectromechanical element, comprising the step of providing at least one electrically conductive passage into the substrate, connecting the first side to the second side and the step of securing at least one support to the first side of the substrate, wherein the at least one electrically conductive passage 8 is uncovered by thinning the substrate material with the mechanical stability being ensured by means of the support. The object is also achieved by a microelectromechanical component comprising a substrate having a first side and a second side which is substantially opposite from the first side, at least the first side comprising at least one microelectromechanical element and at least one support which is connected to the first side of the substrate, wherein the substrate has at least one electrically conductive passage, connecting the first side to the second side, and the substrate is thinned, the mechanical stability of the thinned substrate being ensured by means of the support.

According to the invention, a microelectromechanical component is produced from a substrate having a first side and a second side which is substantially opposite from the first side, at least the first side having at least one microelectromechanical element, as a result of at least one conductive passage, which connects the first side to the second side, being introduced into the substrate. In this way, the process according to the invention creates an electrically conductive connection between the first and second sides of the substrate. Therefore, the contacts for the microelectromechanical elements can be laid on the opposite side of the substrate from the elements, which is a particularly space-saving arrangement.

Furthermore, the process preferably comprises the step of securing at least one support to the first side of the substrate. The order of the processing steps of securing the support and introducing the conductive passage is not fixed. For example, the securing of the support may be carried out before or after the introduction of the passage. It is also possible for the introduction of the passage to be carried out in a plurality of steps. In this case, the support may also be secured between two of these introduction process steps.

It is particularly preferable for at least one of the steps of securing the support or of introducing at least one conductive passage to be carried out while the components are still joined to the wafer. This allows particularly economic production of MEMS modules. Moreover, securing the support results in at least partial packaging of the modules in the wafer assembly, corresponding to a wafer level packaging.

The conductive passage can advantageously be used to create in particular a through electrical contact to the electrical connection of the micromechanical components from the opposite side of the substrate. In this way, bulky contacts which disrupt the function of the component can be avoided on the side of the substrate which has the micromechanical components.

The introduction of the electrically conductive passage may be carried out in various ways, and the different processing options can also be selected as a function of the material used for the substrate.

In particular, the step of introducing the conductive passage may comprise the step of producing a recess by removing substrate material.

The recesses can be produced using various processes, depending on the substrate material. By way of example, such recesses can be produced by means of a dry-etching process. By way of example, in particular an anisotropic dry-etching process, such as for example the "ASE process", which is based on $SF_6$ radicals, is particularly suitable for silicon semiconductor substrates. Various wet-etching processes, such as for example anisotropic etching using KOH solution, which is recommended for Si wafers with a (100) orientation, are also suitable for such semiconductor substrates. Grinding or ultrasonic lapping can also be used to produce recesses.

Moreover, in the process the step of introducing the conductive passage may comprise the step of filling the passage with an electrically conductive material.

The material used may, inter alia, be a conductive epoxy. Filling with an epoxy of this type represents a variant of the process which is simple to carry out. To make it possible to produce a conductive passage with a particularly low electrical resistance, it is advantageous if the conductive material comprises a metal which is deposited in the recess by electrodeposition.

Electrically conductive connections can also be produced by means of doping or ion implantation, so that it is unnecessary for the substrate material to be removed, at least for the doped regions.

Particularly in order to create a connection between the microelectromechanical element and the electrically conductive passage for the through-contact, it is advantageous if the process additionally comprises the step of producing at least one electrical contact surface. The electrically conductive passage may be in direct contact with the contact surface or may be connected to the latter via an electrical connection, such as for example an interconnect.

It is preferable for the contact surface to be produced on the first side of the substrate.

Furthermore, the substrate can advantageously be thinned. This has the result, inter alia, that the depth required for the conductive passage can be reduced. In this context, it is particularly advantageous if the thinning of the substrate takes place after the securing of the support. Since the support joined to the substrate imparts additional strength to the substrate, in this way the substrate can be thinned further without imposing excessive mechanical loads on the substrate and thereby destroying it, which would be possible without a secured support. By way of example, according to a preferred embodiment of the process, the substrate is adhesively bonded to the support, for example a thin glass disc, on the first side. As a result, the micromechanical elements on the substrate are protected and the arrangement acquires additional stability. A suitable epoxy resin can generally be used as the adhesive. The substrate can then be mechanically thinned on the back surface by means of a grinding process, the mechanical stability still being ensured by the support.

Electrically conductive passages can be produced, inter alia, with the aid of thinning the substrate by grinding as a result of the first side of the optical chip being photolithographically patterned and recesses being introduced in the form of etching pits. In this variant, the conductive passages are preferably located next to the contact surfaces or bonding pads for connection of the microelectromechanical elements. The etching pits are then filled with a conductor and an interconnect is applied from the etching pit to the bonding pad. Then, the transparent cover can be applied and after that the wafer is thinned on the back surface until the conductive fillings of the etching pits project on the second side.

The substrate may comprise a wide range of suitable materials. In addition to the semiconductor materials which are customary for MEMS modules, the substrate may also comprise glasses, metals, ceramics, piezo-electric materials, plastics or composite materials.

Moreover, the process can advantageously be refined further by producing a structured support. The structuring may take place completely or partially in the state in which the support has already been joined to the substrate or separately therefrom.

The structuring of the support may advantageously comprise the introduction of at least one structure which forms a cavity and/or a through-opening. The cavity may, for example, be used to receive fluids or may also surround projecting parts of the microelectromechanical elements on the substrate. A through-opening can be used, for example, to produce a connection between the microelectromechanical elements and the environment, so that, for example, light can impinge on the micromechanical components without being impeded.

Moreover, the support can be structured in such a way that it comprises at least one trench, in particular a V-groove, the trench preferably extending in a direction along the surface of the support. Such trenches can be used, inter alia, to receive optical fibres.

In general terms, a mechanical fit in or on the support can be created by means of the structuring. Therefore, an element which is introduced into the fit can be introduced at a precise orientation with respect to the substrate and/or the micromechanical elements. A fit of this type is suitable in particular for optical elements, such as for example waveguides, optical lenses or prisms.

However, mechanical fits are not the only option for joining the optical elements to the support. Rather, it is also possible for the support itself to be structured in such a way that it has optical components. Integrated optical elements of this type may, for example, comprise lenses or gratings.

For certain MEMS applications it may also be advantageous if the step of structuring the support comprises the step of producing a spacer, in particular for at least one optical element and/or at least one further support. Spacers can be used, for example, to increase the focal length of lenses and thereby reduce their image errors. However, a spacer may also be of benefit for other components and other purposes. By way of example, the spacer may also create a defined spacing from a further micromechanical component.

According to the invention, MEMS modules for more complex applications can advantageously be produced, inter alia, if, in addition, the step of producing a structured support comprises the step of producing a receiving part, in particular for fluids and/or optical elements and/or piezo-electric elements and/or micromechanical elements and/or electronic components. This refinement of the production process creates the possibility of integrating a wide range of functions in parallel in an MEMS component.

For certain applications, MEMS elements may also be located on opposite sides of the substrate. For structures of this type, it may be particularly advantageous if there is a connection between the structures on opposite sides. Therefore, the process may additionally comprise the step of introducing further passages which produce a functional connection between the structures. For this purpose, by way of example, light-conducting, fluid-conducting or heat-conducting passages are particularly suitable.

According to a preferred embodiment of the process according to the invention, the at least one conductive passage is introduced from the first side of the substrate, and the support is secured after the at least one conductive passage has been introduced.

According to a further preferred embodiment, the at least one conductive passage is introduced from the second side of the substrate. In this case, the cover can be secured before or after the introduction of the passage.

To secure the MEMS module either on a circuit board or on a further substrate and to produce the required electrical contact with the module, the process may in addition comprise the step of applying a soldering bead to the at least one conductive passage. If there is a multiplicity of electrical connections with corresponding associated conductive passages for making contact through the substrate, in this way a ball grid array is produced on the second side of the substrate.

Moreover, the through-contact which is created by means of the conductive passage which has been introduced into the substrate results in the particularly advantageous possibility of adding further substrates. For example, the substrates may comprise integrated semiconductor circuit arrangements or substrates with further MEMS elements. Therefore, the process according to the invention makes it possible to produce three-dimensional MEMS systems or three-dimensional MEMS modules.

It is also within the scope of the invention to provide a microelectromechanical component which is produced in particular using the inventive process described above, the microelectromechanical component having a substrate having a first side and a second side which is substantially opposite from the first side, and the first side of the microelectromechanical component comprising at least one micromechanical element. The substrate additionally has at least one electrically conductive passage connecting the first side to the second side.

In a particularly preferred embodiment of the component, the latter has a support which is connected to the first side of the substrate. The support protects the microelectromechanical elements from harmful environmental influences, such as for example from the risk of mechanical damage.

The cover of the component may have at least one optical element, in particular a prism and/or a grating and/or a lens and/or an optical filter. Therefore, certain optical functions may already advantageously be integrated in the component for optical applications, with the result that, for example, it is also possible for an overall structure of an optical system with MEMS component to be produced in a more compact design.

Moreover, the support may have at least one cavity and/or a through-opening, for example in order to be able to receive or carry fluids.

The support may advantageously also have at least one fit. Such a fit allows precise orientation of elements which are held therein. By way of example, the fit may be suitable for receiving an optical element, in particular a lens and/or a waveguide and/or a grating and/or a prism.

In addition to such fits, the support may also comprise at least one receiving part. Inter alia, a circuit arrangement and/or a piezo-electric component and/or an active or passage electronic element may be accommodated in the receiving part. In this way, it is possible for additional functions to be integrated in the component. By way of example, an electronic circuit which provides the voltages required to actuate the microelectromechanical elements may be accommodated therein. In this way it is also possible, for example, to accommodate active or passive electronic filter elements which can be used, for example, to stabilize the control voltages of a microelectromechanical element.

In a particularly simple form, the support may be joined to the substrate by adhesive bonding, in particular by means of epoxy resin.

In particular, the support may also have a plurality of layers. These can be used, inter alia, to increase the strength. It is also possible for various functional structures to be combined with one another on and within the support by using a combination of a plurality of layers. For example, it is in this way possible for multiple-element optics to be integrated in the support.

The through-contact produced by the conductive passages can be used in particular also to produce a component which includes a plurality of substrates stacked on top of one another. In addition to stacked substrates with MEMS elements, it is also possible, by way of example, for substrates with integrated electronic circuits to be combined with the first substrate. Depending on their function, the individual substrates may also comprise different materials. For this purpose, one such multilayer component comprises at least two substrates which are arranged one above the other, the further substrate having at least one connection contact and electrical contact being produced between the at least one electrically conductive passage of the substrate and the connection surface of the at least one further substrate.

BRIEF DESCRIPTION OF THE DRAWINGS

The invention is to be explained in more detail below on the basis of embodiments and with reference to the appended drawings, in which identical reference numerals in the individual drawings denote identical or similar components. In the drawings:

FIGS. 1A to 1E: show the process steps involved in the production of a microelectromechanical component in accordance with a first embodiment of the process according to the invention with reference to cross-sectional views through a wafer, FIGS. 3A to 3D: show the process steps involved in the production of a microelectromechanical component in accordance with a further embodiment of the process according to the invention with reference to cross-sectional views through a wafer.

DETAILED DESCRIPTION OF THE INVENTION

Figure 2A:
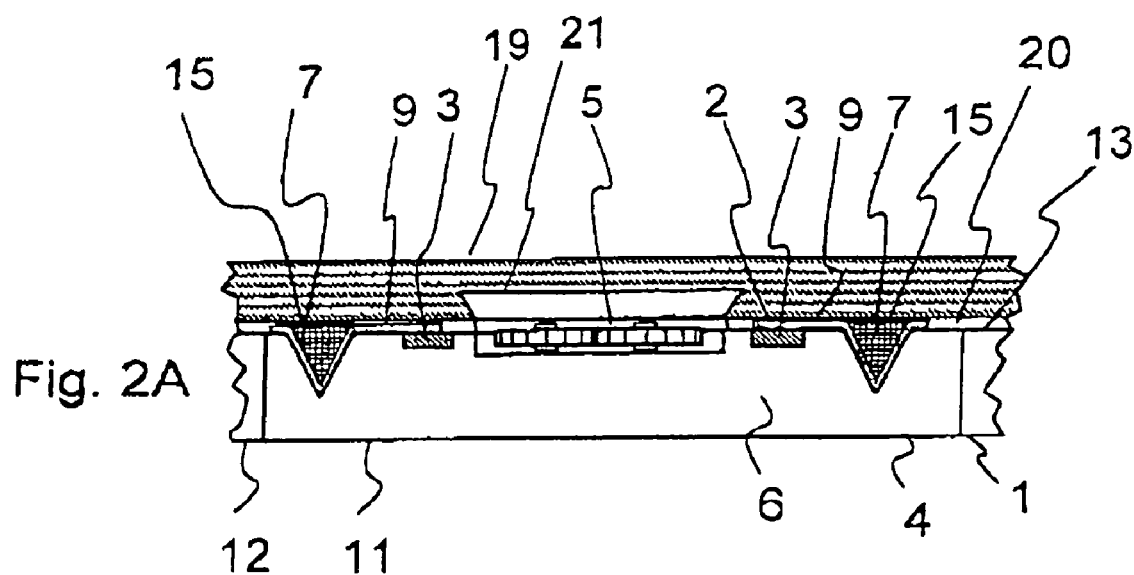
FIGS. 2A to 2B: show a variant of the process steps illustrated with reference to FIGS. 1D and 1E, FIG. 2C: shows a cross-sectional view through an MEMS module which has been separated from the wafer.

In the following text, reference is made first of all to FIGS. 1A to 1E, which use cross-sectional views through part of a substrate wafer 1 to illustrate the process steps involved in the production of a microelectromechanical component in accordance with a first embodiment of the process according to the invention.

The process steps which are explained below are carried out while the component is still joined to the wafer in the present exemplary embodiment. The wafer 1 has been provided with microelectromechanical structures 5 by the time the processing phase illustrated in FIG. 1A is reached.

On the wafer 1 there is a multiplicity of dice 11, 12, 13, of which the die denoted by 11 is illustrated in full. The individual microelectromechanical components are obtained after separation of the dice 11, 12, 13 in the wafer assembly. In order for voltage to be supplied, the microelectromechanical elements 5 are connected to contact surfaces 3. Contact surfaces and microelectromechanical structures are situated on the first side 2 of the substrate 6 of the wafer 1. It is now an object of the invention to produce electrical contact on the second side 4 of the substrate 6, in order to achieve a particularly space-saving arrangement of the elements of an MEMS component and the possibility of stacking with further substrates.

In this connection, FIG. 1B shows a further processing step. Recesses 7 have been introduced into the substrate 6. These recesses can be introduced into the substrate by means of a suitable etching procedure, for example. Inter alia anisotropic etching of an Si(100) substrate using KOH is suitable for the production of the etching pits; in this case, etching pits with an aperture angle of approximately 70° are formed. The introduction of the recesses is independent of the production of the microelectromechanical elements and of the contact surfaces. Therefore, the order in which these processing steps are carried out is not binding.

Then, in a subsequent processing phase, as shown in FIG. 1C, electrical connections 9 are produced between the recesses 7 and the contact surfaces 3. To produce the contacts, the etching pits 7 and regions of the first side 2 between the etching pits 7 can be coated with a metal. In this way, a metal layer is formed as electrical connection 9 which is located on the walls of the etching pits and on regions between the etching pits, the layer at least partially covering the contact surfaces in order to produce a reliable contact. By way of example, aluminium is a suitable contact-making metal.

Then, the metal-coated recesses 7 are filled with a conductive material, as shown with reference to FIG. 1D, so that there are fillings 15 in the recesses 7.

In this exemplary embodiment, the recesses 7 do not extend through the substrate 6. Therefore, in the processing phase shown in FIG. 1D, they do not yet form conductive passages which connect the first side 2 to the second side 4. To produce these passages, in a further processing step which is illustrated in FIG. 1E, the wafer 1 can be ground from the second side 4 so as to reduce its thickness until the conductive material of the fillings emerges on the second side 4 and forms contact surfaces 17. The recess 7 which has been filled with the filling 9 therefore forms an electrically conductive passage which connects the first side 2 of the substrate 6 to the second side 4.

Figure 2B:
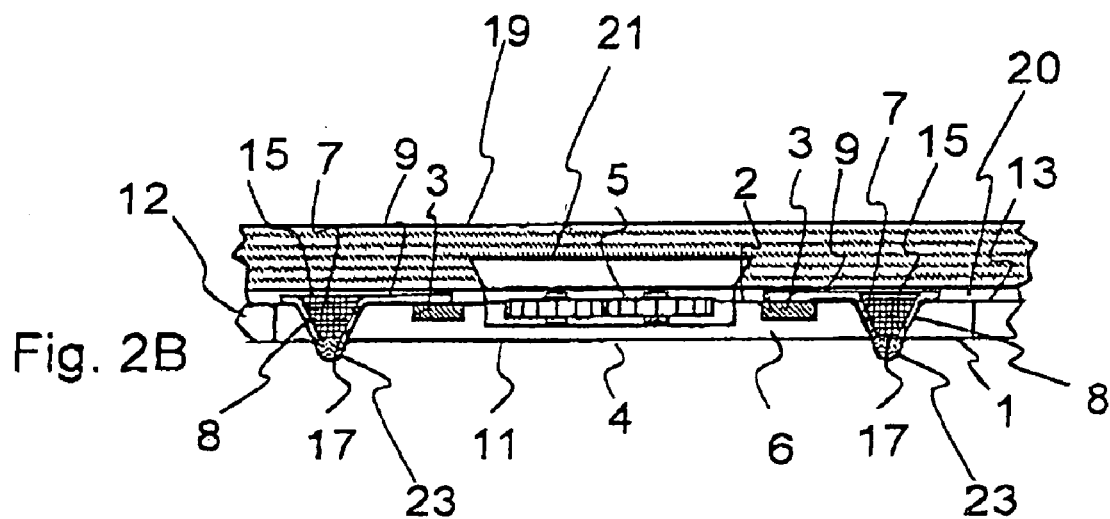

FIGS. 2A and 2B show a variant of the process steps which have been shown with reference to FIGS. 1D and 1E. The process differs to the extent that a support 19 is secured to the first side 2 of the substrate 6. By way of example, for optical MEMS applications, the support 19 may comprise a transparent wafer, so that light can impinge on the MEMS elements 5. The support 19 is also structured in such a way that a cavity 21 is formed when it has been joined to the wafer 1. By way of example, the cavity creates a hermetic seal of the MEMS elements 5 without restricting their mobility. On the other hand, the cavity 21 can also be designed to receive and carry fluids. The support may, for example, be adhesively bonded to the substrate 6, so that there is an adhesive bond 20 between support 19 and first side 2 of the substrate 6.

Moreover, the support 19 provides the overall structure with additional mechanical strength. In particular, the wafer 1 is mechanically supported by the support. The result of this is that the wafer 1 can be ground until it is thinner than is the case with an unsupported wafer as shown in FIG. 1E. the thinning processing step is shown in FIG. 2B. The securing of the support in this context offers the additional advantage that the sensitive MEMS elements 5 are protected from damage during the machining.

In addition, in the processing phase shown in FIG. 2B, soldering beads 23 have been applied to the contact surfaces 17 of the conductive passages 8, in order to be able to produce an electrical connection, for example to a circuit board or a further module. The soldering beads form a ball grid array on the wafer 1.

Figure 2C:
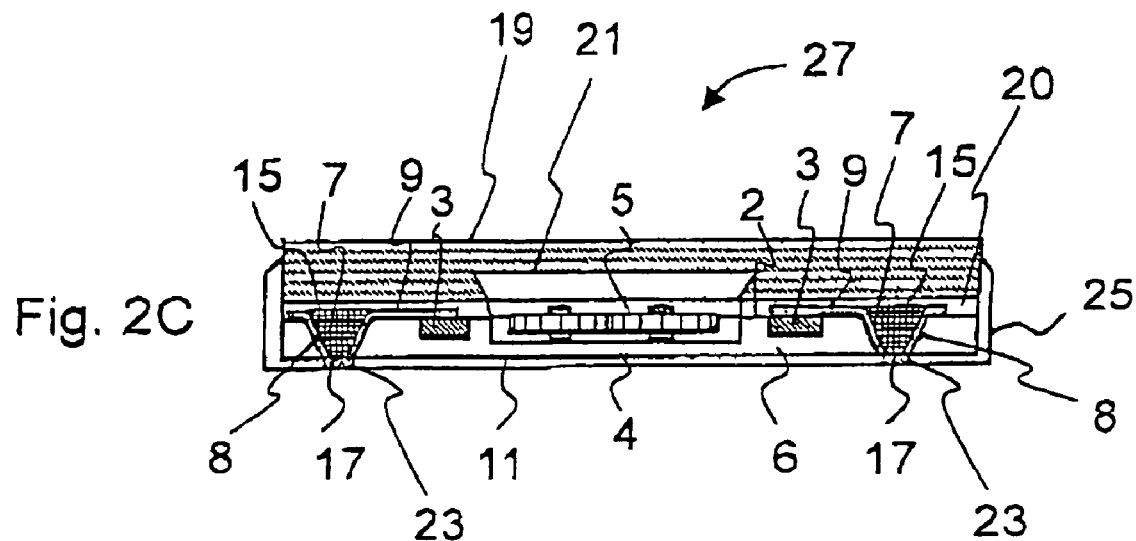

FIG. 2C shows a cross-sectional view through an MEMS module 27 which is obtained from a wafer assembly as shown in FIG. 2B after further processing steps. The module is produced by dicing or separating the dice 11 from the wafer 1.

To produce a housing which completely surrounds the module 27, the module is additionally provided with an encapsulation 25. The encapsulation may be made, for example, from an epoxy resin. On that side of the module on which the soldering beads 23 are located, the encapsulation can be partially ground away again, so that the soldering beads are partially uncovered. This allows subsequent soldering to another component by melting the soldering beads which have been partially ground away.

FIGS. 3A to 3E show the processing steps involved in the production of an MEMS module in accordance with a further embodiment of the invention. In this embodiment of the process too, the processing steps are carried out while the module is still joined to the wafer.

The processing state of the wafer shown in FIG. 3A substantially corresponds to that of the wafer illustrated in FIG. 1A. By way of example, an electromechanically adjustable reflector arrangement is illustrated as microelectromechanical element 5 in FIG. 3A. In this embodiment too, the microelectromechanical elements 5 of the dice are in each case connected to one or more contact surfaces 3 for electrical supply.

FIG. 3B shows the wafer assembly after the wafer 1 has been joined to a structured support 19. In this case, the support 19 has a through-opening 29. In addition to the through-opening, the support 19 also comprises a mechanical fit 31. The mechanical fit is suitable for receiving a lens 33. The lens focuses light onto the reflector of the microelectromechanical element 5. The illustrated structuring of the support and the lens which has been introduced into the fit are only examples. In fact, the support may also be advantageously structured in a wide range of other ways. The structuring may take place both before the joining and partially or completely in the state in which the support has already been joined to the substrate 6.

FIG. 3C shows the wafer assembly after the introduction of recesses 7. By contrast with the processes which have been explained with reference to FIGS. 1A to 1E and 2A to 2C, in this embodiment of the process the conductive passage will be introduced from the second side 4 of the substrate 6. For this purpose, recesses 7 which lie opposite the contact surfaces on the first side 2 of the substrate are introduced from the second side 4, as shown in FIG. 2C. The recesses extend as far as the contact surfaces 3.

FIG. 3D shows the wafer assembly after fillings 15 of the conductive material have been introduced into the recesses 7. The conductive fillings, which are in electrical contact with the contact surfaces 3, create a conductive passage 8 which connects the first side 2 to the second side 4 of the substrate 6. Contact surfaces 17 are in turn created on the second side 4 by the introduction of the fillings 15. These contact surfaces 17 may in turn be provided with soldering beads 23 for electrical connection of the MEMS structures 5. Moreover, the wafer 1 has once again been provided on the second side 4 with an encapsulation 26, resulting substantially in wafer level packaging. The encapsulation may consist, for example, of a plastics material, such as for example an epoxy resin. To make the soldering beads accessible again for subsequent contact to be made, the encapsulation may be partially ground away, until the soldering beads are partially uncovered at the surface, before the dice are separated from the wafer 1 or from the wafer assembly comprising wafer 1 and support 19.

Figure 4:
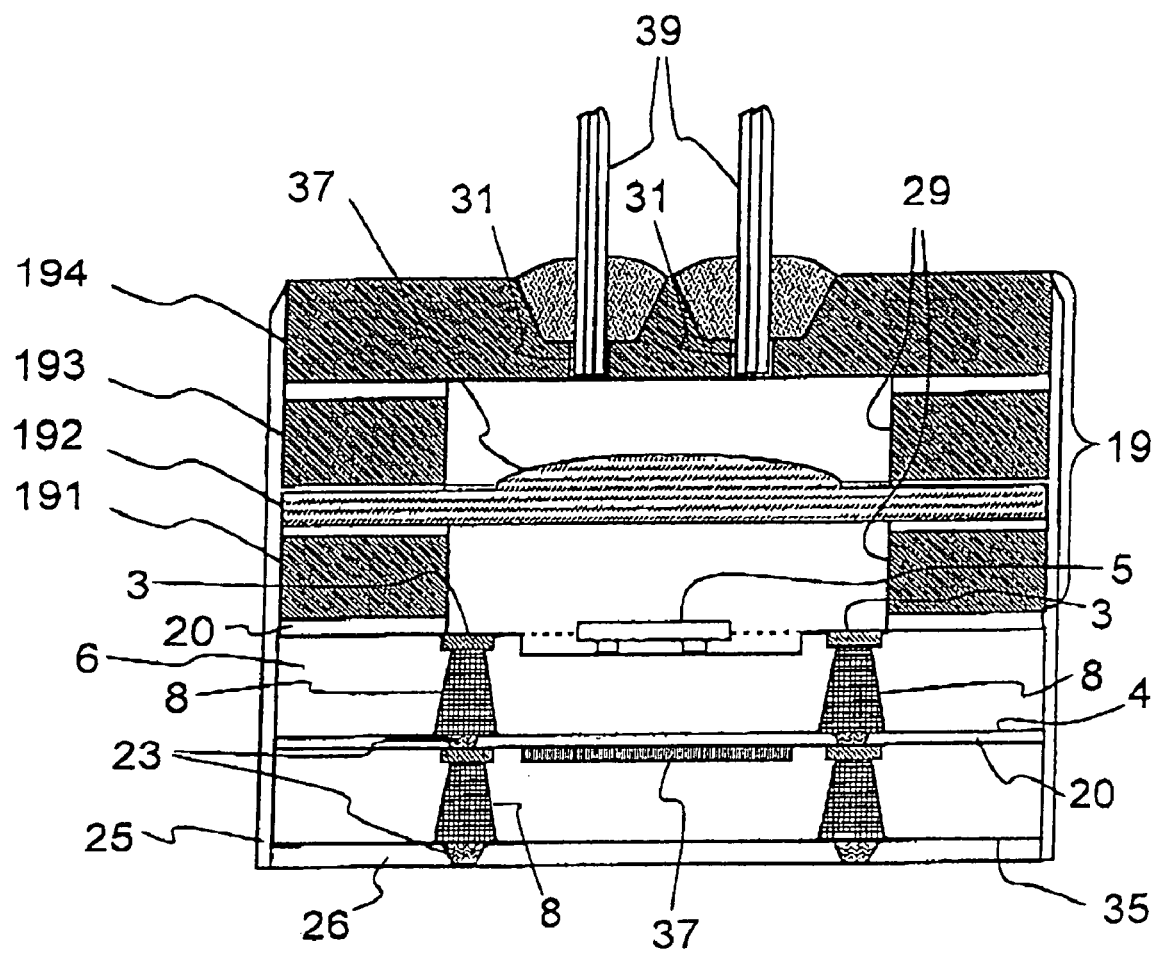
FIG. 4: shows an MEMS module with a multilayer, structured support and substrates stacked on top of one another.

The following text refers to FIG. 4, which shows an MEMS module with multilayer, structured support and substrates stacked on top of one another, in a cross-sectional illustration. The MEMS component comprises a substrate 6 which has been processed in accordance with the process steps which have been shown with reference to FIGS. 3A to 3D. By contrast, however, the embodiment shown in FIG. 4 comprises a multilayer support 19. The support 19 is composed of the layers 191, 192, 193 and 194. The layers 191 and 193 each have a through-opening 29. Between these layers there is a layer 192 which is structured in such a way that it includes an optical element, in this exemplary embodiment an integrated optical lens 37. The layers 191 and 193 serve as spacers for the lens 37 and for the layer 194, which includes mechanical fits 31 for waveguides 39.

Moreover, during the production of the MEMS components while they are still joined to the wafer, a further substrate 35 was secured to the substrate 6. The further substrate 35 comprises an active layer 37 with integrated semiconductor circuits. These can be used, for example, to actuate the MEMS elements 5. Alternatively, in this way stacking with one or more MEMS modules is also possible.

The further substrate 35, like the substrate 6, has contact surfaces 3. In this case, contact is made with the MEMS elements 5 via the through-contact produced by means of the conductive passages 8 in the substrate 6 and the soldering beads 23 which have been arranged on the passages 8 and are soldered to the contact surfaces 3 of the further substrate 35. The contact surfaces 3 of the further substrate 35 are in turn connected in the same way, as described above, to the opposite side of the further substrate 35 via electrically conductive passages 8. It is also possible for the contacts for supplying power to the active layer 37 to be laid on the opposite side of the substrate 35. In this way, all the electrical contacts of the stacked component are on the opposite side from the waveguides. The side of the component 27 from which the waveguides are supplied therefore remains completely free of disrupting bonding wires or other contacts of the component.

Once again, soldering beads have been applied to the conductive passages 8 of the further substrate. An encapsulation or packaging of the parts 6, 35 and 191 to 194 which have been joined while still part of the wafer may be effected in the same way as has been explained with reference to FIG. 2C, by applying an encapsulation layer 26 to the side of the substrate 35 which has the soldering beads and then grinding the encapsulation layer 26 away again until the soldering beads project on the surface which has been ground down.

What is claimed is:

1. A process for producing microelectromechanical components from a substrate having a first side and a second side which is substantially opposite from the first side, at least the first side having at least one microelectromechanical element, comprising the steps of securing at least one support which is suitable for ensuring the mechanical stability of the substrate to the first side of the substrate, thinning the substrate material, introducing at least one electrically conductive passage into the substrate, whereby said step of introducing at least one electrically conductive passage into the substrate is carried out subsequently to said step of thinning the substrate material, and wherein the step of providing the at least one electrically conductive passage comprises the step of producing a recess by removing substrate material and filling said recess with a conductive epoxy.

2. The process according to claim 1, wherein the step of securing comprises at least one of the steps of securing the support and of introducing at least one electrically conductive passage that takes place while the components are still joined to the wafer.

3. The process according to claim 1, wherein the step of removing the substrate material is selected from a group consisting of dry-etching, wet-etching, grinding and ultrasonic lapping.

4. The process according to claim 1, wherein the conductive material comprises a metal which is deposited in the recess by electrodeposition.

5. The process according to claim 1, further comprising the step of producing at least one electrical contact surface.

6. The process according to claim 5, comprising the step of producing a contact surface on the first side of the substrate.

7. The process according to claim 1, in which the substrate is selected from a group consisting of a semiconductor material, a glass, a metal, a ceramic material, a piezo-electric material, a plastic and a composite material.

8. The process according to claim 1, further comprising a step of applying a soldering bead to the at least one conductive passage.

9. The process according to claim 1, comprising the step of securing at least one further substrate to the substrate.

10. A process for producing microelectromechanical components from a substrate having a first side and a second side which is substantially opposite from the first side, at least the first side having at least one microelectromechanical element, comprising the steps of securing at least one support which is suitable for ensuring the mechanical stability of the substrate to the first side of the substrate, thinning the substrate material, introducing at least one electrically conductive passage into the substrate, whereby said step of introducing at least one electrically conductive passage into the substrate is carried out subsequently to said step of thinning the substrate material, and wherein the step of introducing the at least one electrically conductive passage comprises the step of at least one of doping and ion implantation.

11. A process for producing microelectromechanical components from a substrate having a first side and a second side which is substantially opposite from the first side, at least the first side having at least one microelectromechanical element, comprising the steps of securing at least one support which is suitable for ensuring the mechanical stability of the substrate to the first side of the substrate, thinning the substrate material, introducing at least one electrically conductive passage into the substrate, whereby said step of introducing at least one electrically conductive passage into the substrate is carried out subsequently to said step of thinning the substrate material, said process further comprising the step of structuring the support.

12. The process according to claim 11, in which the structuring step comprises the step of introducing at least one structure which forms at least one of a cavity and a through-opening.

13. The process according to claim 12, in which the step of structuring the support comprises the step of producing at least one trench, the trench extending in a direction along a surface of the support.

14. The process according to claim 11, in which the step of structuring the support comprises the step of producing a mechanical fit.

15. The process according to claim 14, in which the mechanical fit is suitable for receiving an optical element.

16. The process according to claim 14, in which the mechanical fit is suitable for receiving at least one of a waveguide and an optical lens and a prism.

17. The process according to claim 11, in which the step of structuring the support comprises the step of producing a support which includes optical components.

18. The process according to claim 17, in which the step of producing a support which includes optical components comprises the step of producing at least one of optical lenses and gratings.

19. The process according to claim 11, in which the step of structuring the support comprises the step of producing a spacer.

20. The process according to claim 11, in which the step of structuring the support comprises the step of producing a receiving part.

21. The process according to claim 11, further comprising the step of introducing at least one of a light-conducting, fluid-conducting and heat-conducting passage into the substrate.

22. The process according to claim 11, wherein the at least one electrically conductive passage is introduced from the first side of the substrate, and wherein the support is secured after the at least one conductive passage has been introduced.

23. The process according to claim 11, in which the step of structuring the support comprises the step of producing at least one groove, the V-groove extending in a direction along a surface of the support.

24. The process according to claim 11, in which the step of structuring the support comprises the step of producing a spacer for at least one of an optical element and a further support.

25. The process according to claim 11, in which the step of structuring the support comprises the step of producing a receiving part for at least one of fluids, optical elements, piezo-electric elements, micromechanical elements and electronic components.

26. The process according to claim 11, comprising the step of securing at least one further substrate to the substrate, wherein the substrate comprises at least one of integrated semiconductor circuit arrangements and MEMS elements.

27. A process for producing microelectromechanical components from a substrate having a first side and a second side which is substantially opposite from the first side, at least the first side having at least one microelectromechanical element, comprising the steps of securing at least one support which is suitable for ensuring the mechanical stability of the substrate to the first side of the substrate, thinning the substrate material, introducing at least one electrically conductive passage into the substrate, whereby said step of introducing at least one electrically conductive passage into the substrate is carried out subsequently to said step of thinning the substrate material, wherein the at least one conductive passage is introduced from the second side of the substrate.

28. A microelectromechanical component comprising a substrate having a first side and a second side which is substantially opposite from the first side, at least the first side comprising at least one microelectromechanical element and at least one support which is connected to the first side of the substrate, wherein the substrate has at least one electrically conductive passage, connecting the first side to the second side, and wherein the substrate is thinned, the mechanical stability of the thinned substrate being ensured by means of the support, whereby said conductive passage is introduced into the thinned substrate, and wherein the support has at least one optical element.

29. The component according to claim 28, wherein the support has at least one of a cavity and a through-opening.

30. The component according to claim 28, wherein the support has at least one fit.

31. The component according to claim 30, wherein the fit is suitable for receiving an optical element.

32. The component according to claim 30, wherein the fit is suitable for receiving an optical element selected from a group at least consisting of a lens, a waveguide, a grating and a prism.

33. The component according to claim 28, in which the support has a receiving part.

34. The component according to claim 33, in which the receiving part is adapted to receive at least one of a circuit arrangement, a piezo-electric component and an active or passive electronic element.

35. The component according to claim 28, wherein the support is adhesively bonded to the substrate.

36. The component according to claim 28, wherein the support has a plurality of layers.

37. The component according to claim 28, wherein the support has at least one optical element selected from a group consisting of a prism, a grating, a lens and an optical filter.

38. A microelectromechanical component comprising a substrate having a first side and a second side which is substantially opposite from the first side, at least the first side comprising at least one microelectromechanical element and at least one support which is connected to the first side of the substrate, wherein the substrate has at least one electrically conductive passage, connecting the first side to the second side and wherein the substrate is thinned, the mechanical stability of the thinned substrate being ensured by means of the support, whereby said conductive passage is introduced into the thinned substrate, said microelectromechanical component comprising at least one further substrate, the substrate being arranged above the at least one further substrate.

39. The component according to claim 38, wherein the at least one further substrate has at least one connection contact, and the conductive passage is in electrical contact with the connection contact.

40. A microelectromechanical component comprising a substrate having a first side and a second side which is substantially opposite from the first side, at least the first side comprising at least one microelectromechanical element and at least one support which is connected to the first side of the substrate, wherein the substrate has at least one electrically conductive passage, connecting the first side to the second side and wherein the substrate is thinned, the mechanical stability of the thinned substrate being ensured by means of the support, whereby said conductive passage is introduced into the thinned substrate, wherein the support is adhesively bonded to the substrate by an epoxy resin.

* * * * *